United States Patent
Park et al.

(10) Patent No.: US 9,583,553 B2
(45) Date of Patent: Feb. 28, 2017

(54) ORGANIC LIGHT EMITTING DISPLAY DEVICE

(71) Applicant: Samsung Display Co., LTD., Yongin-si, Gyeonggi-Do (KR)

(72) Inventors: Gyung-Soon Park, Seoul (KR); Keum-Nam Kim, Seoul (KR); Min-Jae Jeong, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/830,097

(22) Filed: Aug. 19, 2015

(65) Prior Publication Data

US 2016/0240603 A1 Aug. 18, 2016

(30) Foreign Application Priority Data

Feb. 13, 2015 (KR) .................. 10-2015-0022432

(51) Int. Cl.
*H01L 27/32* (2006.01)
*G02F 1/13* (2006.01)
(Continued)

(52) U.S. Cl.
CPC ............ *H01L 27/3279* (2013.01); *G02F 1/13* (2013.01); *G09G 3/20* (2013.01); *G09G 3/32* (2013.01); *G09G 3/3225* (2013.01); *G09G 3/3233* (2013.01); *H01L 27/3211* (2013.01); G09G 2300/0426 (2013.01); G09G 2300/0452 (2013.01); G09G 2300/0465 (2013.01); G09G 2300/0814 (2013.01); G09G 2300/0819 (2013.01); G09G 2300/0866 (2013.01); G09G 2310/0224 (2013.01)

(58) Field of Classification Search
CPC . H01L 27/32; H01L 27/3279; H01L 27/3211; H01L 27/3248
See application file for complete search history.

(56) References Cited

U.S. PATENT DOCUMENTS

2004/0256996 A1 12/2004 Osame et al.
2010/0177024 A1 7/2010 Choi
(Continued)

FOREIGN PATENT DOCUMENTS

KR 1020130068714 A 6/2013
KR 1020140085979 A 7/2014
(Continued)

OTHER PUBLICATIONS

Extended European Search Report for Application No. 151875812-1904 dated Jun. 10, 2016.

*Primary Examiner* — Phuc Dang
(74) *Attorney, Agent, or Firm* — Cantor Colburn LLP

(57) ABSTRACT

An organic light emitting display device includes a substrate a plurality of pixels disposed along a first direction and a second direction, the first direction and the second direction being substantially parallel to a top surface of the substrate and substantially perpendicular to each other, first wirings which is disposed on the substrate, extends in the first direction, and includes a first low voltage power line, and second wirings which is disposed on the substrate, extends in the second direction, and includes a second low voltage power line electrically connected to the first low voltage power line.

20 Claims, 10 Drawing Sheets

(51) Int. Cl.
*G09G 3/20* (2006.01)
*G09G 3/32* (2016.01)

(56) References Cited

U.S. PATENT DOCUMENTS

| | | | | |
|---|---|---|---|---|
| 2011/0123729 | A1* | 5/2011 | Lee | G02F 1/133512 |
| | | | | 428/1.6 |
| 2013/0208017 | A1 | 8/2013 | Gu et al. | |
| 2014/0183479 | A1* | 7/2014 | Park | H01L 51/56 |
| | | | | 257/40 |
| 2015/0379923 | A1* | 12/2015 | Lee | G09G 3/3233 |
| | | | | 345/206 |

FOREIGN PATENT DOCUMENTS

| | | |
|---|---|---|
| KR | 1020160059501 A | 5/2016 |
| KR | 1020160099979 A | 8/2016 |

* cited by examiner

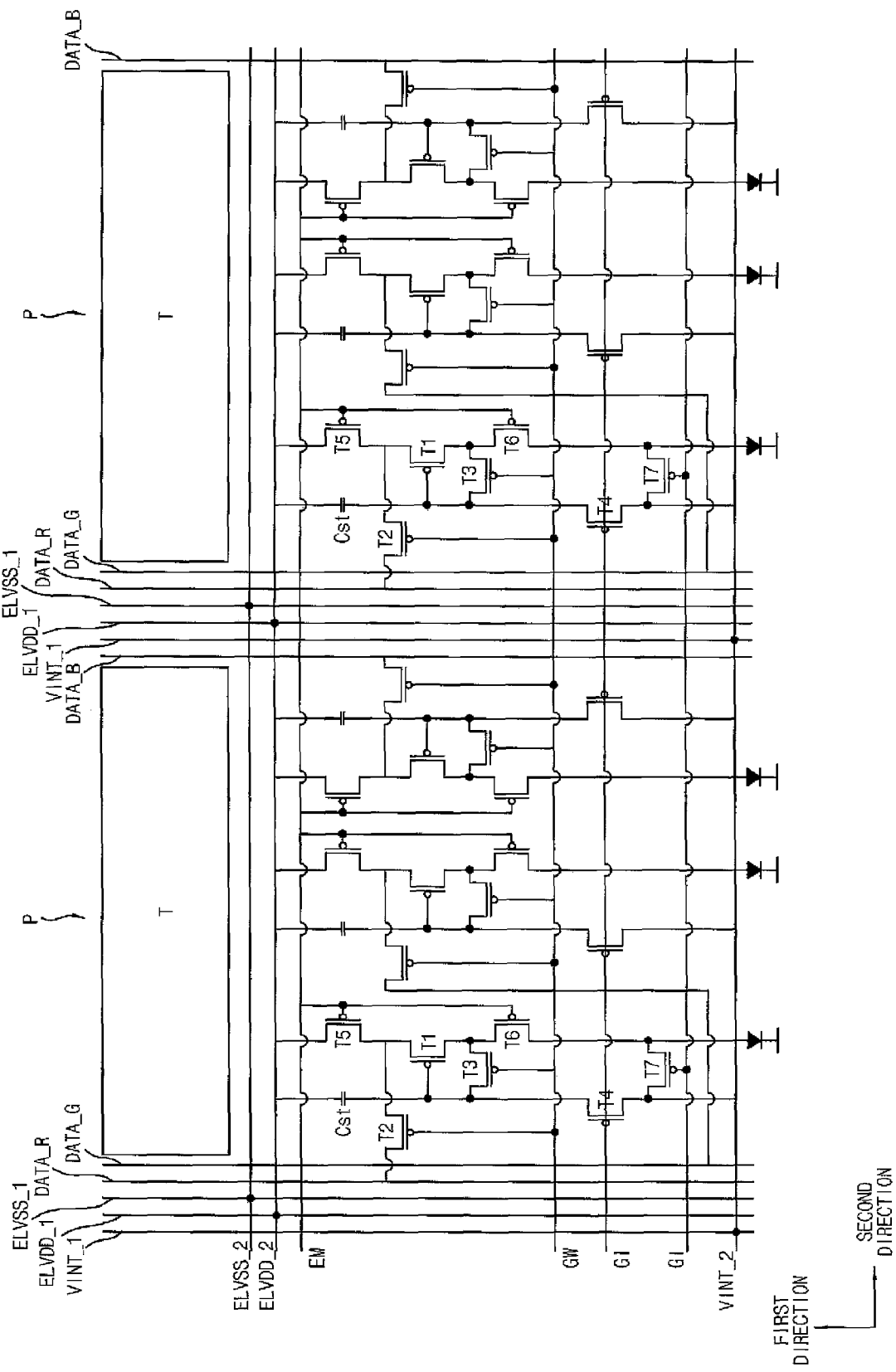

ORGANIC LIGHT EMITTING DISPLAY DEVICE

This application claims priority to Korean Patent Application No. 10-2015-0022432 filed on Feb. 13, 2015, and all the benefits accruing therefrom under 35 U.S.C. §119, the content of which in its entirety is herein incorporated by reference.

BACKGROUND

1. Field

Exemplary embodiments relate to an organic light emitting display ("OLED") device. More particularly, embodiments relate to a transparent OLED device having an improved electrical characteristic.

2. Description of the Related Art

Generally, a display device may display an image based on a light emitted by pixels. Each pixel may include an organic light emitting diode ("OLED"). The OLED may emit a light having a predetermined wavelength depending on a type of an organic material. The OLED may include one of various types of organic materials for emitting one among a red colored light, a green colored light and a blue colored light, for example. The lights having different colors may be combined to form an image in the OLED device.

Recently, a research for a transparent OLED device is in progress. In the transparent OLED device, a thin film transistor or an OLED may be manufactured to be transparent.

SUMMARY

Exemplary embodiments provide an organic light emitting display ("OLED") device capable of having an improved electrical characteristic.

According to exemplary embodiments, an OLED device includes a substrate, a plurality of pixels disposed along a first direction and a second direction, the first direction and the second direction being substantially parallel to a top surface of the substrate and substantially perpendicular to each other, first wirings disposed on the substrate, the first wirings extending in the first direction, the first wirings including a first low voltage power line and second wirings disposed on the substrate, the second wirings extending in the second direction, the second wirings including a second low voltage power line electrically connected to the first low voltage power line.

In exemplary embodiments, the first wirings may include data lines, a first initialization voltage line, and a first high voltage power line.

In exemplary embodiments, the second wirings may further include a second initialization voltage line electrically connected to the first initialization voltage line, and a second high voltage power line electrically connected to the first high voltage power line.

In exemplary embodiments, the first low voltage power line, the first initialization voltage line and the first high voltage power line may be disposed in correspondence with each of the pixels.

In exemplary embodiments, the pixels may include a (3n-2)th pixel, a (3n-1)th pixel and a (3n)th pixel that are sequentially arranged along the second direction.

In exemplary embodiments, the first low voltage power line may be disposed in correspondence with at least one pixel among the (3n-2)th pixel, the (3n-1)th pixel and the (3n)th pixel, the first initialization voltage line is disposed in correspondence with at least one pixel among the (3n-2)th pixel, the (3 n-1)th pixel and the (3n)th pixel, and the first high voltage power line is disposed in correspondence with at least one pixel among the (3n-2)th pixel, the (3n-1)th pixel and the (3n)th pixel.

In exemplary embodiments, the first low voltage power line may be disposed in correspondence with at least two pixels among the (3n-2)th pixel, the (3n-1)th pixel and the (3n)th pixel, the first initialization voltage line is disposed in correspondence with at least two pixels among the (3n-2)th pixel, the (3n-1)th pixel and the (3n)th pixel, and the first high voltage power line is disposed in correspondence with at least two pixels among the (3n-2)th pixel, the (3n-1)th pixel and the (3n)th pixel.

In exemplary embodiments, the pixels may include an odd-numbered pixel and an even-numbered pixel that are sequentially arranged along the second direction.

In exemplary embodiments, the first low voltage power line may be disposed in correspondence with one of the odd-numbered pixel and the even-numbered pixel, the first initialization voltage line is disposed in correspondence with one of the odd-numbered pixel and the even-numbered pixel, and the first high voltage power line is disposed in correspondence with the odd-numbered pixel and the even-numbered pixel.

In exemplary embodiments, the first low voltage power line may be disposed in correspondence with the odd-numbered pixel and the even-numbered pixel, the first initialization voltage line is disposed in correspondence with one of the odd-numbered pixel and the even-numbered pixel, and the first high voltage power line is disposed in correspondence with one of the odd-numbered pixel and the even-numbered pixel.

In exemplary embodiments, the first low voltage power line may be disposed in correspondence with one of the odd-numbered pixel and the even-numbered pixel, the first initialization voltage line is disposed in correspondence with the odd-numbered pixel and the even-numbered pixel, and the first high voltage power line is disposed in correspondence with one of the odd-numbered pixel and the even-numbered pixel.

In exemplary embodiments, each of the pixels may include a first sub-pixel, a second sub-pixel, a third sub-pixel and a transmission portion.

In exemplary embodiments, each of the first sub-pixel, the second sub-pixel and the third sub-pixel may include a pixel circuit, and the pixel circuit may include six or more transistors, a storage capacitor and a light emitting diode.

In exemplary embodiments, the light emitting diode may include a first electrode, an organic light emitting layer ("EL") and a second electrode, and the first electrode, the organic light EL and the second electrode may be sequentially stacked.

In exemplary embodiments, the second electrode may be electrically connected to the first low voltage power line and the second low voltage power line.

In exemplary embodiments, the second electrode may be disposed in the first sub-pixel, the second sub-pixel and the third sub-pixel, and the second electrode may expose the transmission portion.

In exemplary embodiments, the first sub-pixel, the second sub-pixel and the third sub-pixel may be spaced apart from each other, and are sequentially disposed along the second direction, and the transmission portion may be spaced apart from the first through third sub-pixels, and is disposed along the first direction from the first through third sub-pixels.

In exemplary embodiments, a transmittance of the transmission portion may be higher than those of the first sub-pixel, the second sub-pixel and the third sub-pixel, and the first wirings and the second wirings may not overlap the transmission portion.

In exemplary embodiments, each of the transistors may include an active pattern, a gate electrode, a source electrode and a drain electrode, and the second low voltage power line may include a same material as the active pattern.

In exemplary embodiments, the first low voltage power line may include a same material as the source electrode and the drain electrode.

As described above, the OLED device according to exemplary embodiments may include the first and second low voltage power lines for supplying a low power supply voltage, and the first low voltage power line extending in the first direction may cross the second low voltage power line extending in the second direction that is substantially perpendicular to the first direction. Therefore, electrical resistances of the first and second low voltage power lines may be decreased.

BRIEF DESCRIPTION OF THE DRAWINGS

Illustrative, non-limiting exemplary embodiments, advantages and features of this disclosure will be more clearly understood from the following detailed description taken in conjunction with the accompanying drawings, in which:

FIG. 9 is a circuit diagram illustrating an exemplary embodiment of pixels of an OLED device in accordance with the invention.

DETAILED DESCRIPTION

Figure 1:
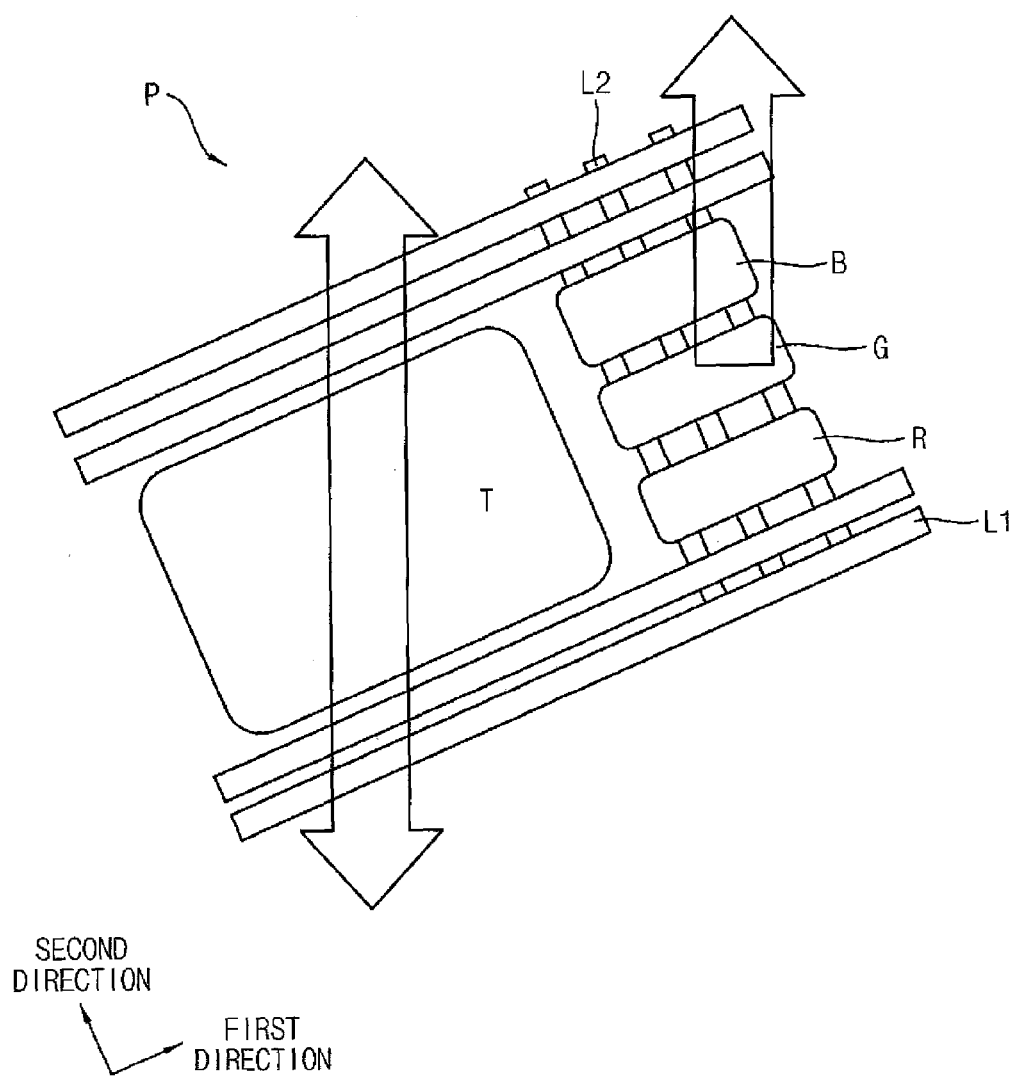
FIG. 1 is a plan view showing exemplary embodiments of pixels in an organic light emitting display ("OLED") device in accordance with the invention.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the invention will be explained in detail with reference to the accompanying drawings.

FIG. 1 is a block diagram showing a schematic structure of pixels in an organic light emitting display ("OLED") device in accordance with exemplary embodiments.

Referring to FIG. 1, the OLED device may include a plurality of pixels P arranged along a first direction and a second direction substantially paralleled to a top surface of a substrate. Each of the pixels P may include a first sub-pixel R, a second sub-pixel G, a third sub-pixel B and a transmission portion (also referred to as a transmission window) T.

In exemplary embodiments, the first sub-pixel R, the second sub-pixel G and the third sub-pixel B may emit red light, green light and blue light, respectively. That is, the red light, green light and blue light may be respectively emitted from light emitting structures in the first sub-pixel R, the second sub-pixel G and the third sub-pixel B.

In exemplary embodiments, the first sub-pixel R, the second sub-pixel G and the third sub-pixel B may have polygonal shapes extending in the first direction, for example. That is, a length of the first sub-pixel R along the first direction may be longer than a width of the first sub-pixel R along the second direction, and a length of the second sub-pixel G along the first direction may be longer than a width of the second sub-pixel G along the second direction, and a length of the third sub-pixel B along the first direction may be longer than a width of the third sub-pixel B along the second direction.

In exemplary embodiments, the third sub-pixel B may have same area as that of the first sub-pixel R or the second sub-pixel G. In an alternative exemplary embodiment, the third sub-pixel B may have a larger area than that of the first sub-pixel R or the second sub-pixel G.

The first sub-pixel R, the second sub-pixel G and the third sub-pixel B may be sequentially disposed in the second direction. In an exemplary embodiment, the first sub-pixel R, the second sub-pixel G and the third sub-pixel B may be spaced apart from each other, and are sequentially disposed along the second direction.

The transmission portion T may be spaced apart from the sub-pixels R, G and B in the first direction. In exemplary embodiments, a ratio of an area of the transmission portion T to an area of the pixel P may range from about 20 percent (%) to about 90%, for example. In an exemplary embodiment, the transmission portion T may have a transmittance higher than those of the sub-pixels R, G and B. Accordingly, the OLED device may have a predetermined transmittance.

Referring to FIG. 1, the OLED device may include first wirings L1 and second wirings L2 that are electrically connected to a circuit of the pixel P. In an exemplary embodiment, each of the first through third sub-pixels R, G and B may include an organic light emitting structure and a pixel circuit electrically controlling the organic light emitting structure, and the first wirings L1 and the second wirings L2 may be electrically connected to the pixel circuits of the first through third sub-pixels R, G and B. Exemplary embodiment of the pixel circuit will be described below with reference to FIGS. 2A and 2B.

The first wirings L1 may extend in the first direction, and may be arranged along the second direction. In exemplary embodiments, the first wirings L1 may be disposed between pixels P that are adjacent to each other in the second direction, and the first wirings L1 may overlap neither the transmission portion T nor the sub-pixels R, G and B.

The second wirings L2 may extend in the second direction, and may be arranged along the first direction. In exemplary embodiments, the second wirings L2 may overlap the sub-pixels R, G and B, and the second wirings L2 may not overlap the transmission portion T.

Figure 2A:
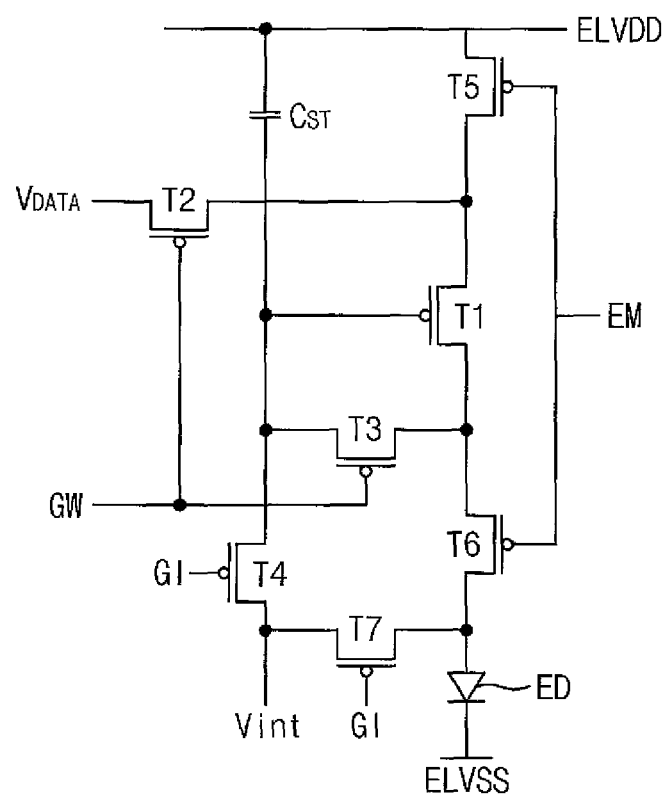
FIG. 2A is a circuit diagram illustrating an exemplary embodiment of a sub-pixel of an OLED device in accordance with the invention.

FIG. 2A is a circuit diagram illustrating an exemplary embodiment of a sub-pixel of an OLED device in accordance with exemplary embodiments. As described above, a pixel circuit may be disposed in each of the sub-pixels of the OLED device.

Each of the sub-pixels may include an organic light emitting diode ED, a first transistor T1, a second transistor T2, a third transistor T3, a storage capacitor $C_{ST}$, a fourth transistor T4, a fifth transistor T5, a sixth transistor T6 and a seventh transistor T7.

The organic light emitting diode ED may emit light based on a driving current. The organic light emitting diode ED may include a first electrode and a second electrode. In exemplary embodiments, the second electrode of the organic light emitting diode ED may be supplied with low power supply voltage ELVSS. In an exemplary embodiment, the first electrode of the organic light emitting diode ED may be an anode electrode, and the second electrode may be a cathode electrode, for example. In other exemplary embodiments, the first electrode of the organic light emitting diode ED may be a cathode electrode, and the second electrode may be an anode electrode, for example.

The first transistor T1 may include a gate electrode, a first electrode and a second electrode. In an exemplary embodiment, the first electrode may be a source electrode, and the second electrode may be a drain electrode. In other exemplary embodiments, the first electrode may be a drain electrode, and the second electrode may be a source electrode.

The first transistor T1 may generate the driving current. In an exemplary embodiment, the first transistor T1 may operate in a saturation region. In this case, the first transistor T1 may generate a driving current based on a voltage difference between a gate electrode and a source electrode. A gradation may be expressed based on a magnitude of the driving current. In other exemplary embodiments, the first transistor T1 may operate in a linear region. In this case, a gradation may be expressed based on a sum of time periods during which the driving current is supplied to the organic light emitting diode ED within one frame.

The second transistor T2 may include a gate electrode, a first electrode and a second electrode. The gate electrode may receive a scan signal GW. The first electrode may receive a data signal $V_{DATA}$. The second electrode may be connected to the first electrode of the first transistor T1. In an exemplary embodiment, the first electrode may be a source electrode, and the second electrode may be a drain electrode. In other exemplary embodiments, the first electrode may be a drain electrode, and the second electrode may be a source electrode.

The second transistor T2 may transfer the data signal $V_{DATA}$ to the first electrode of the first transistor T1 during an active period of the scan signal GW. In an exemplary embodiment, the second transistor T2 may operate in a linear region.

The third transistor T3 may include a gate electrode, a first electrode and a second electrode. The gate electrode may receive the scan signal GW. The first electrode may be connected to the second electrode of the first transistor T1. The second electrode may be connected to the gate electrode of the first transistor T1. In an exemplary embodiment, the first electrode may be a source electrode, and the second electrode may be a drain electrode. In other exemplary embodiments, the first electrode may be a drain electrode, and the second electrode may be a source electrode.

The third transistor T3 may connect the gate electrode of the first transistor T1 and the second electrode of the first transistor T1 during the active period of the scan signal GW. Thus, the third transistor T3 may allow the first transistor T1 to be diode-connected during the active period of the scan signal GW. Since the first transistor T1 is diode-connected, a voltage difference between the first electrode of the first transistor T1 and the gate electrode of the first transistor T1 may become a threshold voltage of the first transistor T1. Accordingly, a voltage of the gate electrode of the first transistor T1 may become a sum of a voltage of the data signal $V_{DATA}$ supplied to the first electrode of the first transistor T1 during the active period of the scan signal GW and the voltage difference (i.e., the threshold voltage) of the first transistor T1. That is, the data signal $V_{DATA}$ may be compensated by the threshold voltage of the first transistor T1, and the compensated data signal $V_{DATA}$ may be provided to the gate electrode of the first transistor T1. By this threshold voltage compensation, a non-uniformity problem of the driving current caused by a threshold voltage deviation of the first transistor T1 can be solved. In an exemplary embodiment, the third transistor T3 may operate in a linear region.

The storage capacitor $C_{ST}$ may be connected between a high power supply voltage ELVDD and the gate electrode of the first transistor T1. The storage capacitor $C_{ST}$ may maintain a voltage level of the gate electrode of the first transistor T1 during an inactive period of the scan signal GW. The inactive period of the scan signal GW may include an active period of a light emission signal EM, and the driving current generated by the first transistor T1 may be supplied to the organic light emitting diode ED during the active period of the light emission signal EM. Therefore, the driving current generated by the first transistor T1 may be supplied to the organic light emitting diode ED based on the voltage level maintained by the storage capacitor $C_{ST}$.

The fourth transistor T4 may include a gate electrode, a first electrode and a second electrode. The gate electrode may receive a gate initialization signal GI. The first electrode may receive an initialization voltage Vint. The second electrode may be connected to the gate electrode of the first transistor T1. In an exemplary embodiment, the first electrode may be a source electrode, and the second electrode may be a drain electrode. In other exemplary embodiments, the first electrode may be a drain electrode, and the second electrode may be a source electrode.

The fourth transistor T4 may transfer the initialization voltage Vint to the gate electrode of the first transistor T1 during an active period of the gate initialization signal GI. In an exemplary embodiment, the fourth transistor T4 may operate in a linear region. The fourth transistor T4 may initialize the gate electrode of the first transistor T1 to the initialization voltage Vint. Thus, the gate initialization signal GI may serve as a data initialization signal.

In an exemplary embodiment, the first transistor T1 may be a p-channel metal oxide semiconductor ("PMOS") transistor, and a voltage level of the initialization voltage Vint may be sufficiently lower than that of the data signal $V_{DATA}$ maintained by the storage capacitor $C_{ST}$ in a previous frame, for example. In other exemplary embodiments, the first transistor T1 may be an n-channel metal oxide semiconductor ("NMOS") transistor, and the voltage level of an the initialization voltage Vint may be sufficiently higher than that of the data signal $V_{DATA}$ maintained by the storage capacitor $C_{ST}$ in the previous frame, for example.

In an exemplary embodiment, the gate initialization signal GI of a current stage may be substantially the same as the scan signal GW of a previous stage. In an exemplary embodiment, the gate initialization signal GI applied to a pixel in an (m)th row may be substantially the same as the scan signal GW applied to a pixel in an (m−1)th row, where m is an integer greater than 1, for example. Thus, while the scan signal GW of the current stage is applied to the pixel in the (m−1)th row, the gate initialization signal GI may be applied to the pixel in the (m)th row. Accordingly, while the data signal $V_{DATA}$ is applied to the pixel in the (m−1)th row, the gate electrode of the first transistor T1 of the pixel in the (m)th row may be initialized to the initialization voltage Vint.

The fifth transistor T5 may include a gate electrode, a first electrode and a second electrode. The gate electrode may receive the light emission signal EM. The first electrode may receive the high power supply voltage ELVDD. The second electrode may be connected to the first electrode of the first transistor T1. In an exemplary embodiment, the first electrode may be a source electrode, and the second electrode may be a drain electrode. In other exemplary embodiments, the first electrode may be a drain electrode, and the second electrode may be a source electrode.

The fifth transistor T5 may supply the first electrode of the first transistor T1 with the high power supply voltage ELVDD during an active period of the light emission signal EM. The fifth transistor T5 may prevent the high power supply voltage ELVDD to be supplied during an inactive period of the light emission signal EM. In an exemplary embodiment, the fifth transistor T5 may operate in a linear region. While the fifth transistor T5 supplies the first electrode of the first transistor T1 with the high power supply voltage ELVDD, the first transistor T1 may generate the driving current. Further, while the fifth transistor T5 prevents the high power supply voltage ELVDD to be supplied, the data signal $V_{DATA}$ applied to the first electrode of the first transistor T1 may be provided to the gate electrode of the first transistor T1.

The sixth transistor T6 may include a gate electrode, a first electrode and a second electrode. The gate electrode may receive the light emission signal EM. The first electrode may be connected to the second electrode of the first transistor T1. The second electrode may be connected to the first electrode of the organic light emitting diode ED. In an exemplary embodiment, the first electrode may be a source electrode, and the second electrode may be a drain electrode. In other exemplary embodiments, the first electrode may be a drain electrode, and the second electrode may be a source electrode.

The sixth transistor T6 may transfer the driving current generated by the first transistor T1 to the organic light emitting diode ED during the active period of the light emission signal EM. In an exemplary embodiment, the sixth transistor T6 may operate in a linear region. While the sixth transistor T6 transfers the driving current generated by the first transistor T1 to the organic light emitting diode ED, the organic light emitting diode ED may emit light. Further, the sixth transistor T6 may electrically disconnect the first transistor T1 from the organic light emitting diode ED during the inactive period of the light emission signal EM. While the sixth transistor T6 electrically disconnects the first transistor T1 from the organic light emitting diode ED, the data signal $V_{DATA}$ (or, the data signal $V_{DATA}$ compensated by the threshold voltage of the first transistor T1) at the second electrode of the first transistor T1 may be provided to the gate electrode of the first transistor T1.

The seventh transistor T7 may include a gate electrode, a first electrode and a second electrode. The gate electrode may receive the gate initialization signal GI. The first electrode may receive the initialization voltage Vint. The second electrode may be connected to the first electrode of the organic light emitting diode ED. In an exemplary embodiment, the first electrode may be a source electrode, and the second electrode may be a drain electrode. In other exemplary embodiments, the first electrode may be a drain electrode, and the second electrode may be a source electrode.

The seventh transistor T7 may transfer the initialization voltage Vint to the first electrode of the organic light emitting diode ED during the active period of the gate initialization signal GI. In an exemplary embodiment, the seventh transistor T7 may operate in a linear region. The seventh transistor T7 may initialize the first electrode of the organic light emitting diode ED to the initialization voltage Vint during the active period of the gate initialization signal GI.

Figure 2B:
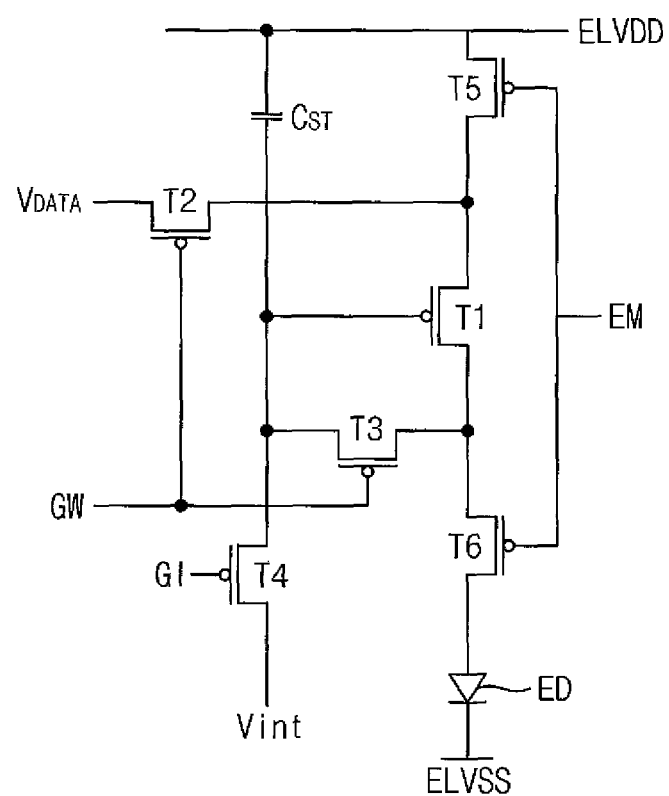
FIG. 2B is a circuit diagram illustrating another exemplary embodiment of a sub-pixel of an OLED device in accordance with the invention.

FIG. 2B is a circuit diagram illustrating an exemplary embodiment of a sub-pixel of an OLED device in accordance with exemplary embodiments.

Referring to FIG. 2B, except the seventh transistor T7, the sub-pixel may be substantially the same as or similar to a sub-pixel described in FIG. 2A. Therefore, repeated description may be omitted.

Although each sub-pixel in FIGS. 3, and 5 to 9 is described as being the sub-pixel of FIG. 2A or the sub-pixel of FIG. 2B, the sub-pixel according to exemplary embodiments of the invention is not limited thereto.

Figure 3:
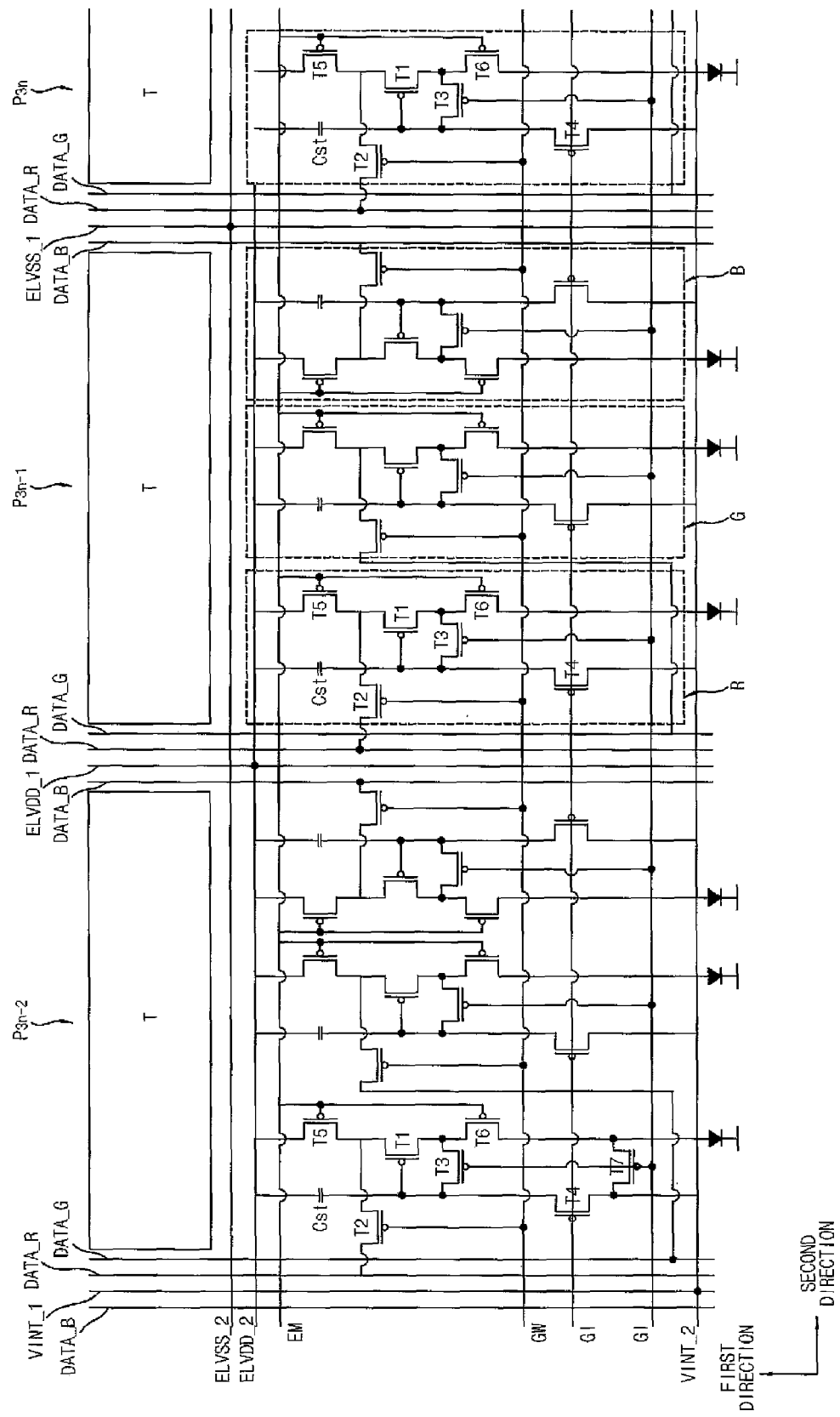
FIG. 3 is a circuit diagram illustrating an exemplary embodiment of pixels of an OLED device in accordance with the invention.

FIG. 3 is a circuit diagram illustrating pixels of an OLED device in accordance with exemplary embodiments.

Referring to FIG. 3, the OLED device may include a plurality of pixels arranged along the first direction and the second direction. The plurality of pixels may include a (3n-2)th pixel $P_{3n-2}$, a (3n-1)th pixel $P_{3n-1}$ and a (3n)th pixel $P_{3n}$ that are sequentially arranged along the second direction, where n is an integer greater than 0.

Each of the pixels $P_{3n-2}$, $P_{3n-1}$, and $P_{3n}$ may include a first sub-pixel R, a second sub-pixel G, a third sub-pixel B and a transmission portion T.

Each of the sub-pixels R, G and B may include the pixel circuit illustrated in FIG. 2A or 2B. In example embodiments, each of the first sub-pixel R and the second sub-pixel G may include transistors illustrated in FIG. 2A or 2B, and the third sub-pixel B may include transistors that are arranged in reverse configuration with respect to those illustrated in FIG. 2A or 2B. However, the configuration of each sub-pixel R, G and B may not be limited thereto. In an exemplary embodiment, the first sub-pixel R may include transistors illustrated in FIG. 2A or 2B, and the second sub-pixel G and the third sub-pixel B may include transistors that are arranged in reverse configuration with respect to those illustrated in FIG. 2A or 2B. In an alternative exemplary embodiment, the first sub-pixel R, the second sub-pixel G and the third sub-pixel B may include transistors illustrated in FIG. 2A or 2B.

Referring back to FIG. 3, the pixel circuit may be electrically connected to first wirings DATA_R, DATA_G, DATA_B, VINT_1, ELVDD_1 and ELVSS_1, that extend in the first direction and second wirings ELVSS_2, ELVDD_2, EM, GW, GI and VINT_2 that extend in the second direction.

The first wirings may include a first data line DATA_R, a second data line DATA_G, a third data line DATA_B, a first initialization voltage line VINT_1, a first high voltage power line ELVDD_1 and a first low voltage power line ELVSS_1.

The first to third data lines DATA_R, DATA_G and DATA_B may be disposed in correspondence with all of the pixels $P_{3n-2}$, $P_{3n-1}$, and $P_{3n}$. In an exemplary embodiment, one of the first to third data lines DATA_R, DATA_G and DATA_B may be arranged in correspondence with the (3n-2)th pixel $P_{3n-2}$, another of the first to third data lines DATA_R, DATA_G and DATA_B may be arranged in correspondence with the (3n-1)th pixel $P_{3n-1}$, and the other of the first to third data lines DATA_R, DATA_G and DATA_B may be arranged in correspondence with the (3n)th pixel $P_{3n}$. In an exemplary embodiment, the first and seconddata lines DATA_R and DATA_G may be disposed in a left side of the corresponding pixel, and the third data line DATA B may be disposed in a right side of the corresponding pixel, for example.

The first data line DATA_R may be electrically connected to the second transistor T2 of the first sub pixel R in each of the pixels $P_{3n-2}$, $P_{3n-1}$, and $P_{3n}$, and the second data line DATA_G may be electrically connected to the second transistor T2 of the second sub-pixel G in each of the pixels $P_{3n-2}$, $P_{3n-1}$, and $P_{3n}$ and the third data line DATA_B may be electrically connected to the second transistor T2 of the third sub-pixel B in each of the pixels $P_{3n-2}$, $P_{3n-1}$, and $P_{3n}$. Therefore, each of the first to third data lines DATA_R, DATA_G and DATA_B may transfer a data signal to each of the sub-pixels.

The first initialization voltage line VINT_1 may be arranged in accordance with some of the pixels $P_{3n-2}$, $P_{3n-1}$, and $P_{3n}$. In example embodiments, the first initialization voltage line VINT_1 may be arranged in accordance with one pixel among the (3n-2)th pixel $P_{3n-2}$, the (3n-1)th pixel $P_{3n-1}$, and the (3n)th pixel $P_{3n}$. In an exemplary embodiment, the first initialization voltage line VINT_1 may be arranged in accordance with the (3n-2)th pixel $P_{3n-2}$, as shown in FIG. 3. The first initialization voltage line VINT_1 may be electrically connected to each of the pixels P3n-2, P3n-1 and P3n through the second initialization voltage line VINT_2 as described below. Therefore, the first voltage line VINT_1 may transfer an initialization voltage to each of the pixel circuits.

The first high voltage power line ELVDD_1 may be arranged in accordance with some of the pixels $P_{3n-2}$, $P_{3n-1}$, and $P_{3n}$. In example embodiments, the first high voltage power line ELVDD_1 may be arranged in accordance with one pixel among the (3n-2)th pixel $P_{3n-2}$, the (3n-1)th pixel $P_{3n-1}$, and the (3n)th pixel $P_{3n}$. In an exemplary embodiment, the first high voltage power line ELVDD_1 may be arranged in correspondence with the (3n-1)th pixel $P_{3n-1}$, as shown in FIG. 3. The first high voltage power line ELVDD_1 may be electrically connected to each of the pixels $P_{3n-2}$, $P_{3n-1}$ and $P_{3n}$ through the second high voltage power line ELVDD_2 as described below. Therefore, the first high voltage power line ELVDD_1 may supply a high power supply voltage to each of the pixel circuits.

The first low voltage power line ELVSS_1 may be arranged in accordance with some of pixels P. In example embodiments, the first low voltage power line ELVSS_1 may be arranged in accordance with one pixel among a (3n-2)th pixel $P_{3n-2}$, a (3n-1)th pixel $P_{3n-1}$, and a (3n)th pixel $P_{3n}$. In an exemplary embodiment, the first low voltage power line ELVSS_1 may be arranged in correspondence with a (3n)th pixel $P_{3n}$, as shown in FIG. 3. The first low voltage power line ELVSS_1 may be electrically connected to each of the pixels $P_{3n-2}$, $P_{3n-1}$ and $P_{3n}$ through the second low voltage power line ELVSS_2 as described below. Therefore, the first low voltage power line ELVSS_1 may transfer a low power supply voltage to each of the pixel circuits.

That is, the first initialization voltage line VINT_1, the first high voltage power line ELVDD_1 and the first low voltage power line ELVSS_1 may be arranged in accordance with a (3n-2)th pixel $P_{3n-2}$, a (3n-1)th pixel $P_{3n-1}$, and a (3n)th pixel $P_{3n}$, respectively. Accordingly, compared to a case that the first initialization voltage line VINT_1, the first high voltage power line ELVDD_1 and the first low voltage power line ELVSS_1 are arranged in accordance with each and every pixel P, it is possible to reduce spaces for disposing the wirings. Therefore, a degree of integration of the pixels P3n-2, P3n-1, and P3n may be improved in the second direction.

Referring back to FIG. 3, the second wirings may include a second low voltage power line ELVSS_2, a second high voltage power line ELVDD_2, a second initialization voltage line VINT_2, a light emission signal wiring EM, a scan signal wiring GW and a gate initialization signal wiring GI.

The second low voltage power line ELVSS_2 may be electrically connected to the first low voltage power line EVLSS_1 crossing the second low voltage power line ELVSS_2. In an exemplary embodiment, the first low voltage power line EVLSS_1 and the second low voltage power line EVLSS_2 for supplying a low power supply voltage may cross each other along the first direction and the second direction. Thus, the first low voltage power line EVLSS_1 and the second low voltage power line EVLSS_2 may form a mesh structure such that electrical resistances of the first and second low voltage power lines EVLSS_1 and EVLSS_2 may be lowered. Although not shown in FIG. 3, the second low voltage power line ELVSS_2 may be electrically connected to one end of the light emitting diode of each sub-pixel R, G and B. Therefore, the second low voltage power line ELVSS_2 may supply a low power supply voltage to the diode in each sub-pixel R, G and B.

The second high voltage power line ELVDD_2 may be electrically connected to the first high voltage power line EVLDD_1 crossing the second high voltage power line ELVDD_2. In an exemplary embodiment, the first high voltage power line EVLDD_1 and the second high voltage power line EVLDD_2 for supplying a high power supply voltage may cross each other along the first direction and the second direction such that electrical resistances of the first and second high voltage power lines EVLDD_1 and EVLDD_2 may be lowered. The second high voltage power line ELVDD_2 may be electrically connected to the fifth transistor T5 and a storage capacitor Cst in each of the pixel circuits. Therefore, the second high voltage power line ELVDD_2 may supply a high power supply voltage to each of the pixel circuits.

The second initialization voltage line VINT_2 may be electrically connected to the first initialization voltage line VINT_1 crossing the second initialization voltage line VINT_2. In an exemplary embodiment, the first initialization voltage line VINT_1 and the second initialization voltage line VINT_2 for transferring an initialization voltage may cross each other along the first direction and the second direction such that electrical resistances of the first and second initialization voltage lines VINT_1 and VINT_2 would be lowered.

Further, the light emission signal wiring EM, the scan signal wiring GW and the gate initialization signal wiring GI may be connected to components in each of the pixel circuits, as described with reference to FIG. 2A or 2B.

Figure 4:
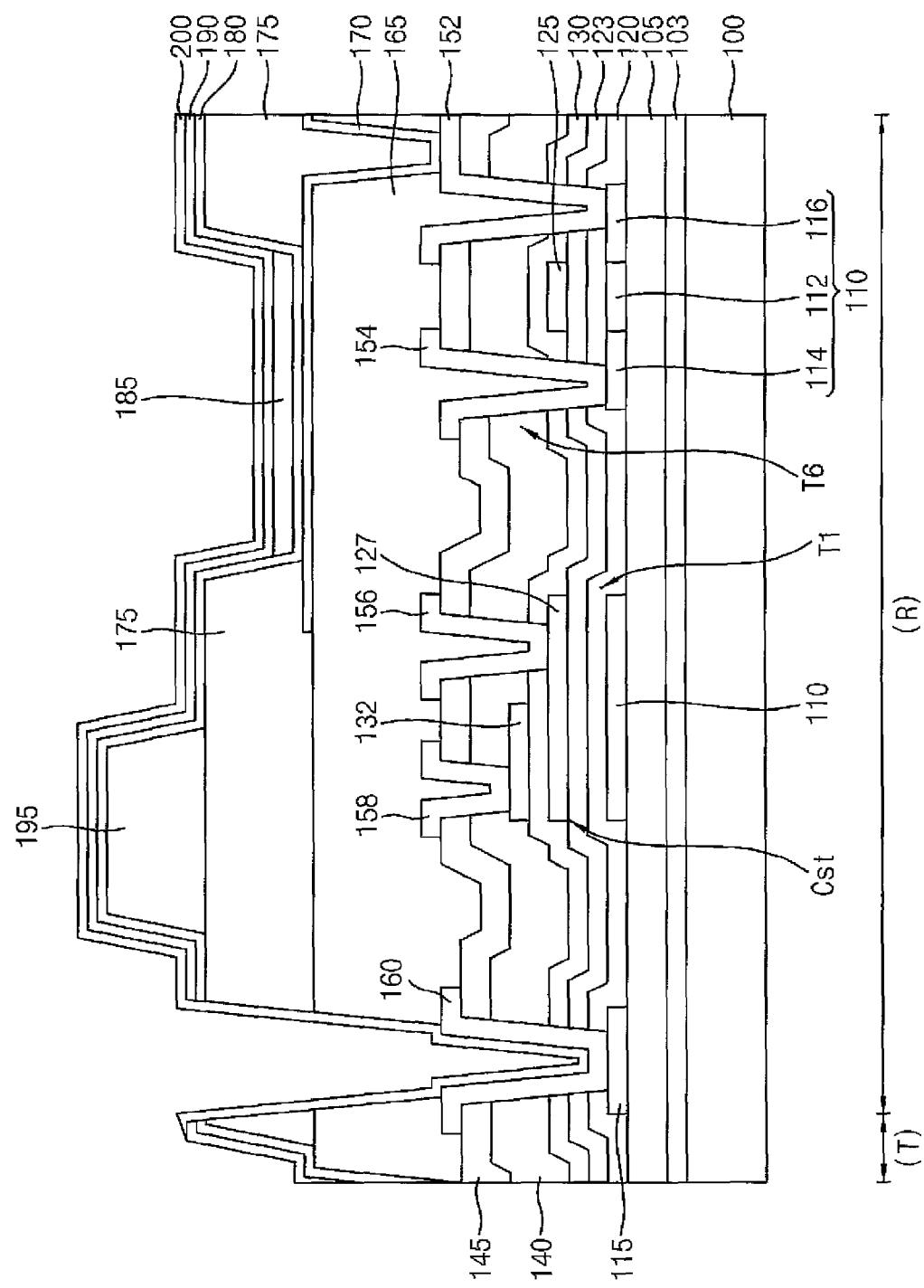
FIG. 4 is a cross-sectional view illustrating an exemplary embodiment of an OLED device in accordance with the invention.

FIG. 4 is a cross-sectional view illustrating an OLED device in accordance with example embodiments;

Referring to FIG. 4, the OLED device may include a substrate, switching structures constituting the pixel circuit, a first electrode 170, light emitting structures, a second electrode 200, etc.

The substrate 100 may include a transparent insulation substrate. In an exemplary embodiment, the substrate 100 may include a glass substrate, a quartz substrate, a transparent plastic substrate, etc., for example. In other example embodiments, the substrate 100 may include a flexible substrate. As mentioned above, the substrate 100 may include an area in which sub-pixels R, G and B and a transmission portion T are disposed.

A first buffer layer 103 and a second buffer layer 105 may be disposed on the substrate 100. The first buffer layer 103 and the second buffer layer 105 may include a variety of materials to prevent impurities from diffusing into the substrate 100 and to planarize a surface of the substrate 100. In example embodiments, the first buffer layer 103 and the second buffer layer 105 may include inorganic materials such as silicon oxide, silicon nitride, silicon oxynitride, aluminum oxide, aluminum nitride, titanium oxide, a titanium nitride, etc., organic material such as polyimide, polyester, acrylic, etc., or a stacked structure thereof. In an exemplary embodiment, the first buffer layer 103 may include a silicon nitride, and the second buffer layer 105 may include a silicon oxide, for example. In other example embodiments, the first buffer layer 103 and the second buffer layer 105 may not be included as necessary.

For the convenience of description, although only a first TFT T1, a sixth TFT T6 and a storage capacitor C_ST shown in FIG. 2A are illustrated in FIG. 4, other transistors may disposed on the second buffer layer 105.

The sixth TFT T6 may include an active pattern 110, a first gate electrode 125, a first source electrode 154 and a first drain electrode 152.

In an exemplary embodiment, the active pattern 110 may include an oxide semiconductor, a polysilicon, a doped polysilicon, an amorphous silicon, a doped amorphous silicon, and the like, for example. In an example embodiment, the oxide semiconductor may include a binary combination (ABx), a ternary compound (ABxCy), a quaternary compound (ABxCyOz), etc which may include indium (In), zinc (Zn), gallium (Ga), tin (Sn), titanium (Ti), aluminum (Al), hafnium (Hf), zirconium (Zr), magnesium (Mg), etc., for example. The above-described elements may be used alone or in a combination thereof. In an exemplary embodiment, the oxide semiconductor may include a G-I-Z-O layer [$(In_2O_3)a(Ga_2O_3)b(ZnO)c$ layer], wherein a, b, and c are real numbers satisfying a≥0, b≥0, c>0, for example. In an exemplary embodiment, the active pattern 110 may include the oxide semiconductor such that a transmittance of external light of the light emitting portion may be increased.

The active pattern 110 may include a source area 114, a drain area 116, that may include dopants, and a channel area 112 disposed between the source are 114 and the drain area 116.

A first gate insulation layer 120 and a second gate insulation layer 123 may be disposed to cover the active pattern, and the first gate electrode 125 may be disposed on the second gate insulation layer 123. In example embodiments, the first gate electrode 125 may overlap the channel area 112 of the active pattern 110.

A first insulating interlayer 130, a second insulating interlayer 140 and a third insulating interlayer 145 are sequentially disposed to cover the first gate electrode 125, and a first source electrode 154 and a first drain electrode 152 may be electrically connected to the source area 154 and the drain area 152 through the insulating interlayers 130, 140 and 145 and gate insulation layers 120 and 123, respectively.

In the sixth transistor T6 shown in FIG. 4, a TFT having a top-gate structure in which the first gate electrode 125 is disposed above the active pattern 110 is illustrated by way of an example. However, the invention may not be limited thereto. In an exemplary embodiment, the sixth transistor T6 may have a bottom-gate structure in which the active pattern is disposed above the gate electrode.

The first TFT T1 may include an active pattern 110, a second gate electrode 127, a second source electrode and a second drain electrode.

In an exemplary embodiment, the active pattern 110 of the first TFT T1 may be unitary with the active pattern 110 of the sixth TFT T6.

The second gate electrode 127 may partially overlap the active pattern 110. The second gate electrode 127 may have a material which may be substantially the same with that of the first gate electrode 125. The first gate electrode 125 and the second gate electrode 127 may be formed at the same time. In an exemplary embodiment, the second gate electrode 127 may be disposed between the second gate insulation layer 123 and the first insulting interlayer 130. The second gate electrode 127 may be connected to a first contact 156 penetrating the insulating interlayers 130, 140 and 145.

Referring back to FIG. 4, the storage capacitor Cst may include a second gate electrode 127, a second conductive pattern 132 and a first insulating interlayer 130 disposed between the second gate electrode 127 and the second conductive pattern 132.

The second gate electrode 127 may operate as a gate electrode of the first transistor T1 and an electrode of the storage capacitor C_ST at the same time.

The second conductive pattern 132 may be disposed on the first insulating interlayer 130, and partially overlap the second gate electrode 127. The second conductive pattern 132 may be electrically connected to the second contact 158 penetrating the second and third insulating interlayers 140 and 145.

A first conductive pattern 115 may be disposed on the second buffer layer 105. The first conductive pattern 115 may be disposed on a same layer as active pattern 110. The first conductive pattern 115 may include dopants, and the first conductive pattern 115 may have a higher electrical conductivity than that of some portion of the active pattern 110. The first conductive pattern 115 may be electrically connected to the second low voltage power line ELVSS_2 shown in FIG. 3.

In example embodiments, the first conductive pattern 115 may be unitary with the second low voltage power line ELVSS_2. In an exemplary embodiment, the second low voltage power line ELVSS_2 may include a material which may be substantially the same with that of the active pattern 110.

A third contact 160 may be electrically connected to the first conductive pattern 115 through the insulating interlayers 130, 140 and 145 and the gate insulation layers 120 and 123. The third contact 160 may be electrically connected to the first low voltage power line ELVSS_1 shown in FIG. 3.

In example embodiments, the third contact 160 may be unitary with the first low voltage power line ELVSS_1. In an exemplary embodiment, the first low voltage power line ELVSS_1 may include a material which may be substantially the same with that of the active pattern 110.

A planarization layer 165 may be disposed to cover the first transistor T1, the sixth transistor T6 and the storage capacitor Cst. In example embodiments, the planarization layer 165 may have an upper surface that is substantially flat.

The first electrode 170 may be disposed on the planarization layer 165. In example embodiments, the first electrode 170 may be electrically connected to the drain electrode 152 through the planarization layer 165. The first electrode 170 may be disposed in correspondence with the sub-pixels R, G and B. That is, the first electrode 170 may not be disposed in the transmission portion T. In an exemplary embodiment, the first electrode 170 may include a transparent conductive material such as an indium zinc oxide ("IZO"), an indium tin oxide ("ITO"), etc.

A pixel defining layer 175 may be disposed on the planarization layer 165, and partially cover the first electrode 170. In example embodiments, the pixel defining layer 175 may be formed using an inorganic insulating material such as a silicon oxide or an organic insulating material.

A spacer 195 may be disposed on the planarization layer 165. The spacer 195 may serve to control a pitch between the substrate 100 and an opposing substrate.

As illustrated in FIG. 4, the light emitting structures disposed on the first electrode 170, the pixel defining layer 175 and spacer 195 may include a hole transfer layer ("HTL") 180, an organic light emitting layer ("EL") 185, an electron transfer layer 190, etc.

The HTL180 may be formed collectively on the first electrodes 170, the pixel defining layer 175 and the spacer 195. In an exemplary embodiment, the HTL180 may be formed without using a mask or a patterning process using an etchant.

The organic light EL 185 may be disposed on the first electrode 170. In example embodiments, the organic light EL 185 may have a thickness of about 200 angstroms (Å) to about 500 Å. More preferably, the organic light EL 185 may have a thickness of about 250 Å to about 350 Å.

The electron transfer layer 190 may be formed collectively on the organic light EL 185 and the HTL180. In an exemplary embodiment, the electron transfer layer 190 may be formed without using a mask or a patterning process using an etchant.

In other example embodiments, a hole injection layer ("HIL") may be further disposed under the hole transfer 180, and the electron injection layer ("EIL") may be further disposed on the electron transfer layer 190.

The second electrode 200 may be disposed on the organic light EL 185 and the electron transfer layer 190. In example embodiments, the second electrode 200 may be disposed not on the transmission portion T but on the sub-pixels R, G and B. Therefore, the second electrode 200 exposure the transmission portion such that a transmittance of the transmission portion may be improved.

The second electrode 200 may be electrically connected to the third contact 160, and the second electrode 200 may be electrically connected to the first low voltage power line ELVSS_1 shown in FIG. 3.

In an exemplary embodiment, the second electrode 200 may include a conductive metal such as magnesium (Mg), aluminum (Al), platinum (Pt), silver (Ag), gold (Au), chromium (Cr), tungsten (W), molybdenum (Mo), titanium (Ti), an alloy thereof, etc. In an exemplary embodiment, the second electrode 200 may have a relatively thin thickness such that the second electrode 200 may have a relatively high transparency.

In example embodiments, the second electrode 200 may be electrically connected to the first low voltage power line ELVSS_1 shown in FIG. 3 and the second low voltage power line ELVSS_2 shown in FIG. 3 through the third contact 160 and the first conductive pattern 115. Therefore, an electrical resistance of lines for supplying the second electrode 200 with a low power supply voltage may be reduced, and electrical characteristic of the OLED device may be improved.

Figure 5:
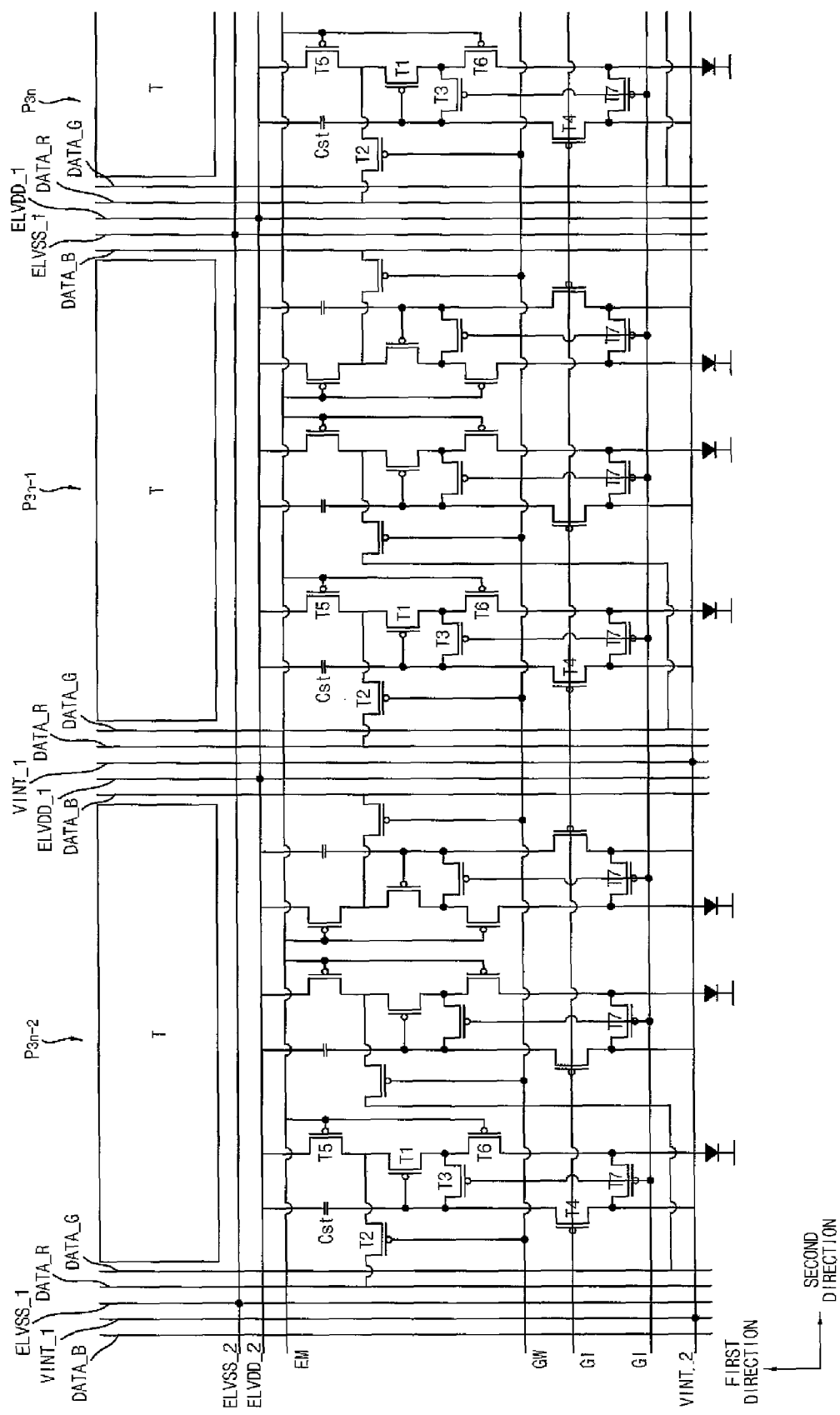
FIG. 5 is a circuit diagram illustrating an exemplary embodiment of pixels of an OLED device in accordance with the invention.

FIG. 5 is a circuit diagram illustrating pixels of an OLED device in accordance with example embodiments. The OLED device may be substantially the same with or substantially similar to the OLED device shown in FIG. 3 except the first wirings DATA_R, DATA_G, DATA_B, VINT_1, ELVDD_1 and ELVSS_1 extending in the first direction.

Referring to FIG. 5, the OLED device may include a plurality of pixels $P_{3n-2}$, $P_{3n-1}$ and pixel $P_{3n}$ disposed along the first direction and the second direction. Particularly, the plurality of pixels $P_{3n-2}$, $P_{3n-1}$ and pixel $P_{3n}$ may include a (3n-2)th pixel $P_{3n-2}$, a (3n-1)th pixel $P_{3n-1}$ and a (3n)th pixel $P_{3n}$ that are arranged along the second direction, where n is an integer greater than 0.

Each of the pixels $P_{3n-2}$, $P_{3n-1}$ and pixel $P_{3n}$ may include a first sub-pixel R, a second sub-pixel G, a third sub-pixel B and a transmission portion T. A pixel circuit may be arranged in each of the sub-pixels R, G and B.

The pixel circuit may be electrically connected to the first wirings DATA_R, DATA_G, DATA_B, VINT_1, ELVDD_1 and ELVSS_1 that extend in the first direction and the second wirings ELVSS_2, ELVDD_2, EM, GW, GI and VINT_2 that extend in the second direction.

The first wirings may include a first data line DATA_R, a second data line DATA_G, a third data line DATA_B, a first initialization voltage line VINT_1, a first high voltage power line ELVDD_1 and a first low voltage power line ELVSS_1.

The first to third data lines DATA_R, DATA_G and DATA_B may be disposed in correspondence with all the pixels $P_{3n-2}$, $P_{3n-1}$ and pixel $P_{3n}$.

The first initialization voltage line VINT_1 may be arranged in accordance with some of the pixels $P_{3n-2}$, $P_{3n-1}$ and pixel $P_{3n}$. In exemplary embodiments, the first initialization voltage line VINT_1 may be arranged in accordance with two pixels among a (3n-2)th pixel $P_{3n-2}$, a (3n-1)th pixel $P_{3n-1}$, and a (3n)th pixel $P_{3n}$. In an exemplary embodiment, the first initialization voltage line VINT_1 may be arranged in accordance with a (3n-2)th pixel $P_{3n-2}$ and a (3n-1)th pixel $P_{3n-1}$, as shown in FIG. 5.

The first high voltage power line ELVDD_1 may be arranged in accordance with some of the pixels $P_{3n-2}$, $P_{3n-1}$ and pixel $P_{3n}$. In exemplary embodiments, the first high voltage power line ELVDD_1 may be arranged in accordance with two pixels among a (3n-2)th pixel $P_{3n-2}$, a (3n-1)th pixel $P_{3n-1}$, and a (3n)th pixel $P_{3n}$. In an exemplary embodiment, the first high voltage power line ELVDD_1 may be arranged in correspondence with a (3n-1)th pixel $P_{3n-1}$ and a (3n)th pixel $P_{3n}$, as shown in FIG. 5.

The first low voltage power line ELVSS_1 may be arranged in accordance with some of the pixels $P_{3n-2}$, $P_{3n-1}$ and pixel $P_{3n}$. In exemplary embodiments, the first low voltage power line ELVSS_1 may be arranged in accordance with two pixels among a (3n-2)th pixel $P_{3n-2}$, a (3n-1)th pixel $P_{3n-1}$, and a (3n)th pixel $P_{3n}$. In an exemplary embodiment, the first low voltage power line ELVSS_1 may be arranged in correspondence with a (3n-2)th pixel $P_{3n-2}$ and a (3n)th pixel $P_{3n}$ as shown in FIG. 5. The first low voltage power line ELVSS_1 may be electrically connected to each of the pixels $P_{3n-2}$, $P_{3n-1}$ and $P_{3n}$ through the second low voltage power line ELVSS_2 described below. Therefore, the first low voltage power line ELVSS_1 may supply a low power supply voltage to each of the pixel circuits.

That is, the first initialization voltage line VINT_1, the first high voltage power line ELVDD_1 and the first low voltage power line ELVSS_1 may be arranged in accordance with some of a (3n-2)th pixel $P_{3n-2}$, a (3n-1)th pixel $P_{3n-1}$, and a (3n)th pixel $P_{3n}$. Therefore, as compared to a case that the first initialization voltage line VINT_1, the first high voltage power line ELVDD_1 and the first low voltage power line ELVSS_1 are arranged in accordance with all of the pixels P3n-2, P3n-1 and pixel P3n, it is possible to save a space for disposing the wirings. Therefore, a degree of integration of the pixels P3n-2, P3n-1 and pixel P3n may be improved in the second direction.

The second wirings ELVSS_2, ELVDD_2, EM, GW, GI and VINT_2 may be substantially the same with second wirings described with reference to FIG. 3.

In exemplary embodiments, the first low voltage power line EVLSS_1 and the second low voltage power line ELVSS_2 for supplying a low power supply voltage may cross each other such that electrical resistances of those would be reduced.

Figure 6:
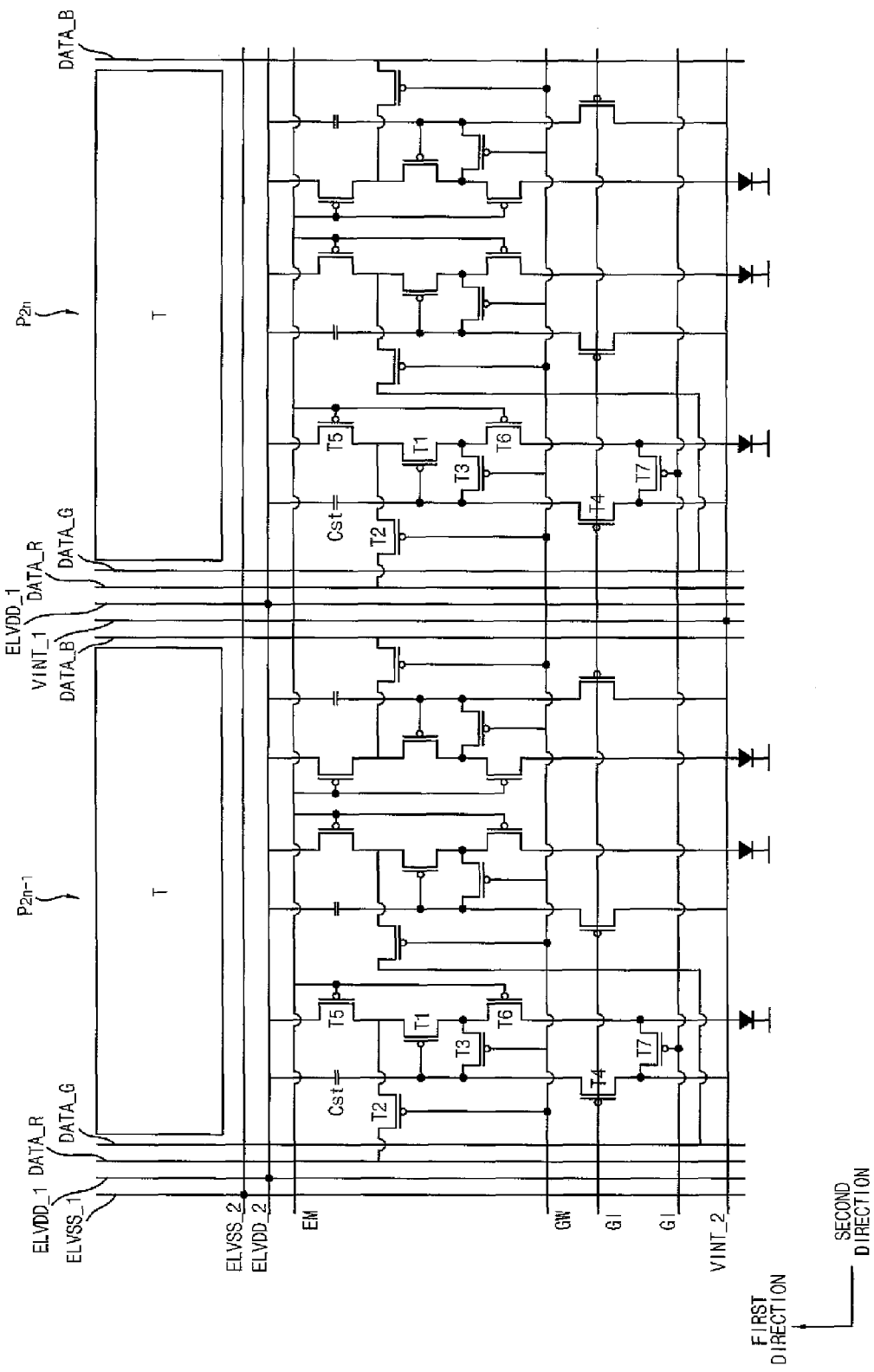
FIG. 6 is a circuit diagram illustrating an exemplary embodiment of pixels of an OLED device in accordance with the invention.

FIG. 6 is a circuit diagram illustrating pixels of an OLED device in accordance with exemplary embodiments. The OLED device may be substantially the same with or substantially similar to the OLED device shown in FIG. 3 except the first wirings DATA_R, DATA_G, DATA_B, VINT_1, ELVDD_1 and ELVSS_1 that extend in the first direction.

Referring to FIG. 6, the OLED device may include a plurality of pixels $P_{2n-1}$ and $P_{2n}$ disposed along the first direction and the second direction. Particularly, the plurality of pixels $P_{2n-1}$ and $P_{2n}$ may include an odd numbered pixel $P_{2n-1}$ and an even numbered pixel $P_{2n}$, where n is an integer greater than 0.

Each of the pixels $P_{2n-1}$ and $P_{2n}$ may include a first sub-pixel R, a second sub-pixel G, a third sub-pixel B and a transmission portion T. A pixel circuit may be arranged in each of the sub-pixels R, G and B.

The pixel circuit may be electrically connected to the first wirings DATA_R, DATA_G, DATA_B, VINT_1, ELVDD_1 and ELVSS_1 that extend in the first direction and the second wirings ELVSS_2, ELVDD_2, EM, GW, GI and VINT_2 that extend in the second direction.

The first wirings may include a first data line DATA_R, a second data line DATA_G, a third data line DATA_B, a first initialization voltage line VINT_1, a first initialization voltage line VINT_1, a first high voltage power line ELVDD_1 and a first low voltage power line ELVSS_1.

The first to third data lines DATA_R, DATA_G and DATA_B may be disposed to correspond to all of the pixels $P_{2n-1}$ and $P_{2n}$. The high voltage power line ELVDD_1 may be disposed to correspond to all of the pixels $P_{2n-1}$ and $P_{2n}$.

The first initialization voltage line VINT_1 may be arranged in accordance with some of the pixels $P_{2n-1}$ and $P_{2n}$. In exemplary embodiments, the first initialization voltage line VINT_1 may be arranged in accordance with one of the odd numbered pixel $P_{2n-1}$ and the even numbered pixel $P_{2n}$. In an exemplary embodiment, the first initialization voltage line VINT_1 may be arranged in accordance with the even numbered pixel $P_{2n}$, as shown in FIG. 6.

The first low voltage power line ELVSS_1 may be arranged in accordance with some of the pixels $P_{2n-1}$ and $P_{2n}$. In exemplary embodiments, the first low voltage power line ELVSS_1 may be arranged in accordance with one of the odd numbered pixel $P_{2n-1}$ and the even numbered pixel $P_{2n}$. In an exemplary embodiment, the first low voltage power line ELVSS_1 may be arranged in correspondence with the odd numbered pixel $P_{2n-1}$, as shown in FIG. 6. The first low voltage power line ELVSS_1 may be electrically connected to each of the pixels $P_{2n-1}$ and $P_{2n}$ through the second low voltage power line ELVSS_2 described below.

That is, the first initialization voltage line VINT_1 and the first low voltage power line ELVSS_1 may be arranged in accordance with the odd numbered pixel $P_{2n-1}$ and the even numbered pixel $P_{2n}$, respectively. Therefore, as compared to a case that the first initialization voltage line VINT_1 and the first low voltage power line ELVSS_1 are arranged in accordance with all of the pixels $P_{2n-1}$ and $P_{2n}$, it is possible to save a space for disposing the wirings such that a degree of integration of the pixels $P_{2n-1}$ and $P_{2n}$ may be improved in the second direction.

The second wirings ELVSS_2, ELVDD_2, EM, GW, GI and VINT_2 may be substantially the same with second wirings described with reference to FIG. 3.

In exemplary embodiments, the first low voltage power line EVLSS_1 and the second low voltage power line ELVSS_2 for supplying a low power supply voltage may cross each other in the first direction and the second direction such that electrical resistances of those would be reduced.

Figure 7:
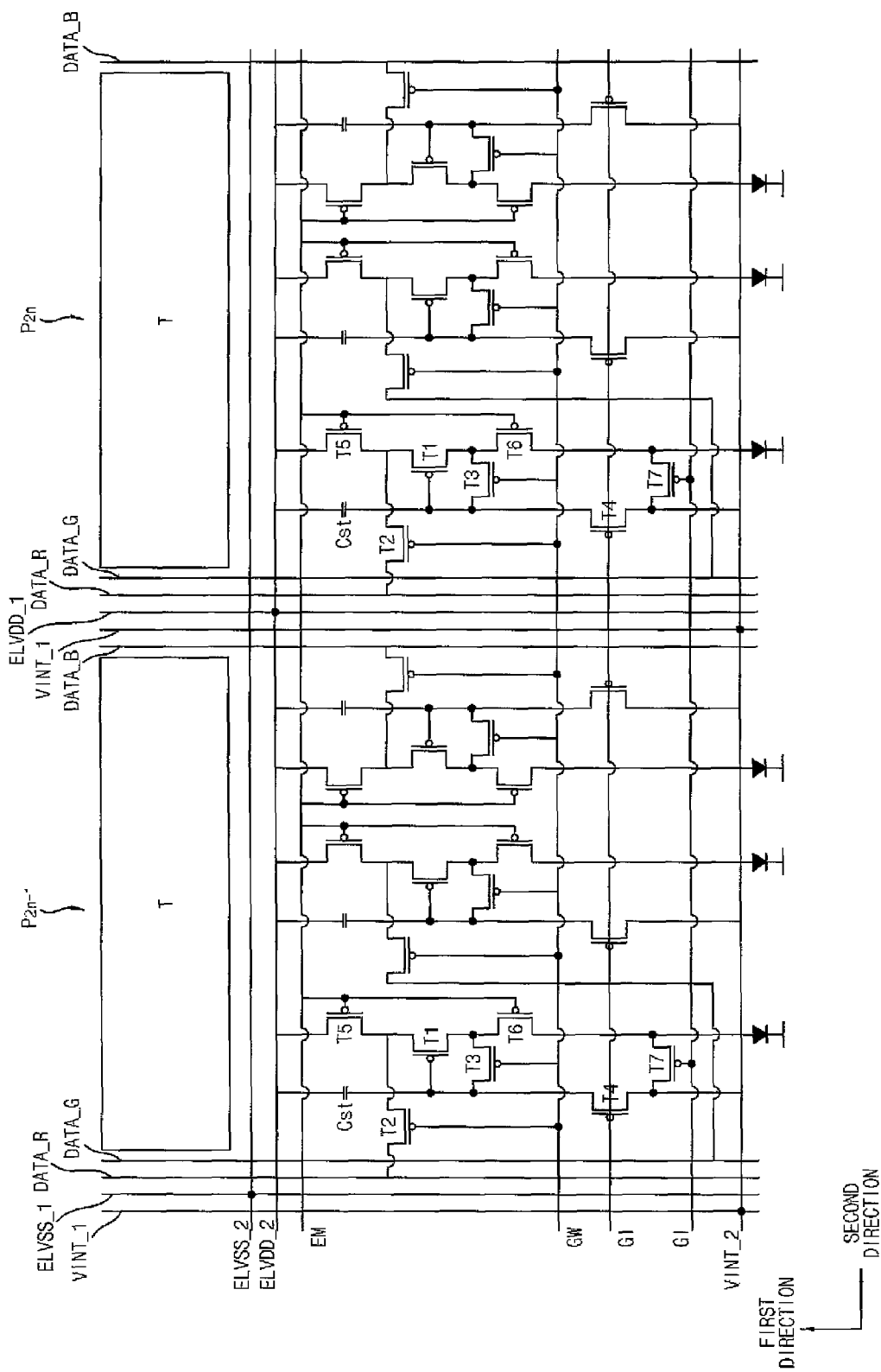
FIG. 7 is a circuit diagram illustrating an exemplary embodiment of pixels of an OLED device in accordance with the invention.

FIG. 7 is a circuit diagram illustrating pixels of an OLED device in accordance with exemplary embodiments. The OLED device may be substantially the same with or substantially similar to the OLED device shown in FIG. 6 except the first wirings DATA_R, DATA_G, DATA_B, VINT_1, ELVDD_1 and ELVSS_1 that extend in the first direction.

Referring to FIG. 7, the OLED device may include a plurality of pixels $P_{2n-1}$ and $P_{2n}$ disposed along the first direction and the second direction, first wirings DATA_R, DATA_G, DATA_B, VINT_1, ELVDD_1 and ELVSS_1 that extend in the first direction and the second wirings ELVSS_2, ELVDD_2, EM, GW, GI and VINT_2 that extend in the second direction.

The first wirings may include a first data line DATA_R, a second data line DATA_G, a third data line DATA_B, a first initialization voltage line VINT_1, a first initialization voltage line VINT_1, a first high voltage power line ELVDD_1 and a first low voltage power line ELVSS_1.

The first to third data lines DATA_R, DATA_G and DATA_B may be disposed to correspond to all of the pixels $P_{2n-1}$ and $P_{2n}$. Also, the high voltage power line ELVDD_1 may be connected to all of the pixels $P_{2n-1}$ and $P_{2n}$ through the second high voltage power line ELVDD_2.

The high voltage power line ELVDD_1 may be arranged in accordance with some of the pixels $P_{2n-1}$ and $P_{2n}$. In exemplary embodiments, the high voltage power line ELVDD_1 may be arranged in accordance with one of the odd numbered pixel $P_{2n-1}$ and the even numbered pixel $P_{2n}$. In an exemplary embodiment, the high voltage power line ELVDD_1 may be arranged in accordance with the even numbered pixel $P_{2n}$, as shown in FIG. 7.

The first low voltage power line ELVSS_1 may be arranged in accordance with some of the pixels $P_{2n-1}$ and $P_{2n}$. In exemplary embodiments, the first low voltage power line ELVSS_1 may be arranged in accordance with one of the odd numbered pixel $P_{2n-1}$ and the even numbered pixel $P_{2n}$. In an exemplary embodiment, the first low voltage power line ELVSS_1 may be arranged in correspondence with the odd numbered pixel $P_{2n-1}$, as shown in FIG. 7. The first low voltage power line ELVSS_1 may be electrically connected to each of the pixels $P_{2n-1}$ and $P_{2n}$ through the second low voltage power line ELVSS_2 described below.

That is, the first low voltage power line ELVSS_1 and the high voltage power line ELVDD_1 may be arranged in accordance with the odd numbered pixel $P_{2n-1}$ and the even numbered pixel $P_{2n}$, respectively. As compared to a case that the first low voltage power line ELVSS_1 and the high voltage power line ELVDD_1 are arranged in accordance with all of pixels $P_{2n-1}$ and $P_{2n}$, it is possible to save a space for disposing the wirings. Therefore, a degree of integration of pixels $P_{2n-1}$ and $P_{2n}$ may be improved in the second direction.

The second wirings ELVSS_2, ELVDD_2, EM, GW, GI and VINT_2 may be substantially the same with second wirings described with reference to FIG. 3.

In exemplary embodiments, the first low voltage power line EVLSS_1 and the second low voltage power line ELVSS_2 for supplying a low power supply voltage may cross each other along the first direction and the second direction such that electrical resistances of those would be reduced.

Figure 8:
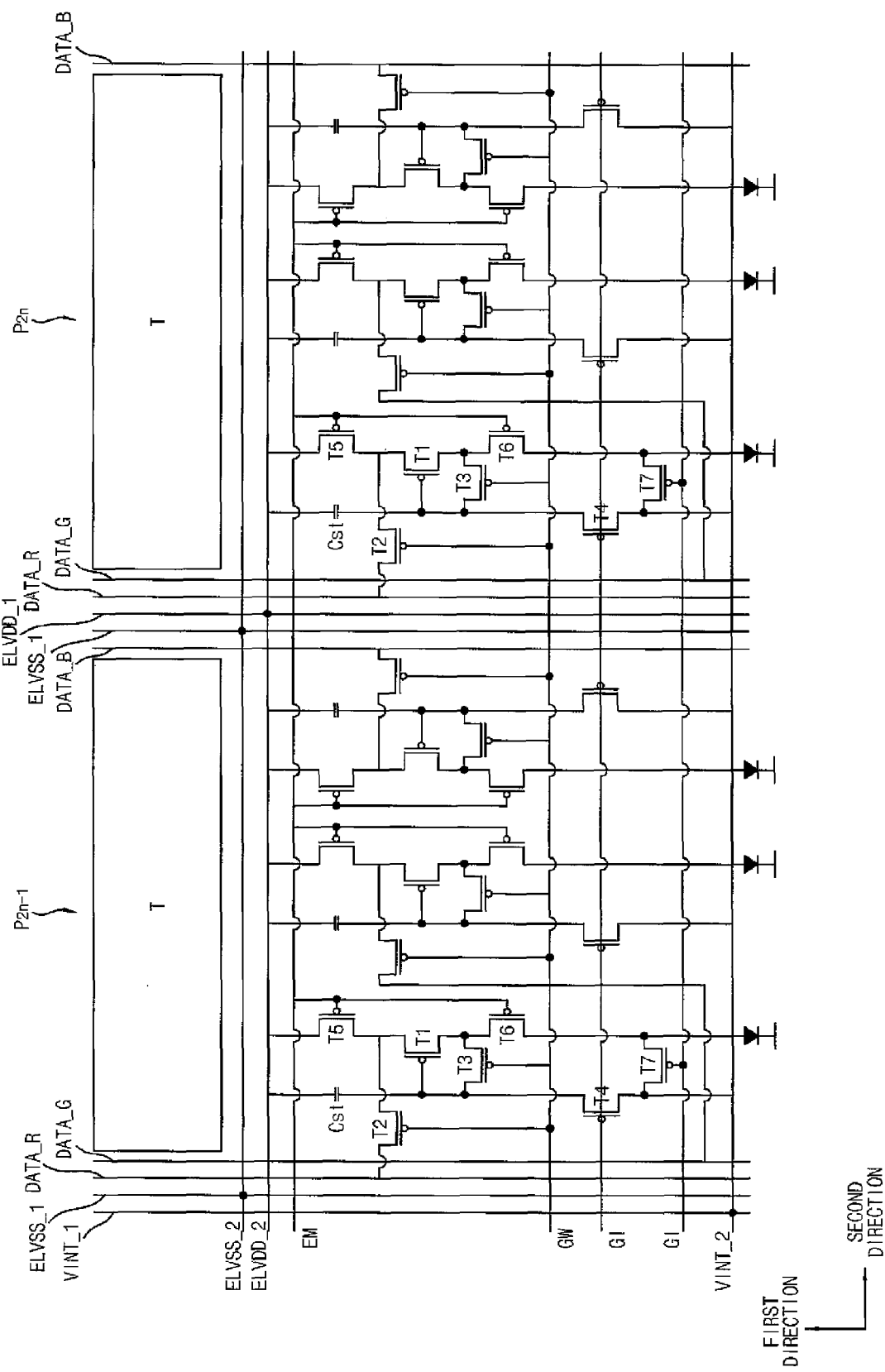
FIG. 8 is a circuit diagram illustrating an exemplary embodiment of pixels of an OLED device in accordance with the invention.

FIG. 8 is a circuit diagram illustrating pixels of an OLED device in accordance with exemplary embodiments. The OLED device may be substantially the same with or substantially similar to the OLED device shown in FIG. 6 except the first wirings DATA_R, DATA_G, DATA_B, VINT_1, ELVDD_1 and ELVSS_1 that extend in the first direction.

Referring to FIG. 8, the OLED device may include a plurality of pixels $P_{2n-1}$ and $P_{2n}$ disposed along the first direction and the second direction, first wirings DATA_R, DATA_G, DATA_B, VINT_1, ELVDD_1 and ELVSS_1 that extend in the first direction and the second wirings ELVSS_2, ELVDD_2, EM, GW, GI and VINT_2 that extend in the second direction.

The first wirings may include a first data line DATA_R, a second data line DATA_G, a third data line DATA_B, a first initialization voltage line VINT_1, a first initialization voltage line VINT_1, a first high voltage power line ELVDD_1 and a first low voltage power line ELVSS_1.

The first to third data lines DATA_R, DATA_G and DATA_B may be disposed to correspond to all of the pixels $P_{2n-1}$ and $P_{2n}$. The high voltage power line ELVDD_1 may be connected to all of the pixels $P_{2n-1}$ and $P_{2n}$ through the second high voltage power line ELVDD_2.

The high voltage power line ELVDD_1 may be arranged in accordance with some of the pixels $P_{2n-1}$ and $P_{2n}$. In exemplary embodiments, the high voltage power line ELVDD_1 may be arranged in accordance with one of an odd numbered pixel $P_{2n-1}$ and an even numbered pixel $P_{2n}$. In an exemplary embodiment, the high voltage power line ELVDD_1 may be arranged in accordance with the even numbered pixel $P_{2n}$, as shown in FIG. 8.

The first initialization voltage line VINT_1 may be arranged in accordance with some of the pixels $P_{2n-1}$ and $P_{2n}$. In exemplary embodiments, the first initialization voltage line VINT_1 may be arranged in accordance with one of the odd numbered pixel $P_{2n-1}$ and the even numbered pixel $P_{2n}$. In an exemplary embodiment, the first initialization voltage line VINT_1 may be arranged in accordance with the odd numbered pixel $P_{2n-1}$, as shown in FIG. 8.

That is, the first initialization voltage line VINT_1 and the high voltage power line ELVDD_1 may be arranged in accordance with the odd numbered pixel $P_{2n-1}$ and the even numbered pixel $P_{2n}$, respectively. As compared to a case that the first initialization voltage line VINT_1 and the high voltage power line ELVDD_1 are arranged in accordance with all of the pixels $P_{2n-1}$ and $P_{2n}$, it is possible to save a space for disposing the wirings. Therefore, a degree of integration of pixels $P_{2n-1}$ and $P_{2n}$ may be improved in the second direction.

The second wirings ELVSS_2, ELVDD_2, EM, GW, GI and VINT_2 may be substantially the same with second wirings described with reference to FIG. 3.

In exemplary embodiments, the first low voltage power line EVLSS_1 and the second low voltage power line ELVSS_2 for supplying a low power supply voltage may cross each other along the first direction and the second direction such that electrical resistances of those would be reduced.

FIG. 9 is a circuit diagram illustrating pixels of an OLED device in accordance with exemplary embodiments. The OLED device may be substantially the same with or substantially similar to the OLED device shown in FIG. 6 except the first wirings DATA_R, DATA_G, DATA_B, VINT_1, ELVDD_1 and ELVSS_1 that extend in the first direction.

Referring to FIG. 9, the OLED device may include a plurality of pixels P disposed along the first direction and the second direction, first wirings DATA_R, DATA_G, DATA_B, VINT_1, ELVDD_1 and ELVSS_1 that extend in the first direction and the second wirings ELVSS_2, ELVDD_2, EM, GW, GI and VINT_2 that extend in the second direction.

The first wirings may include a first data line DATA_R, a second data line DATA_G, a third data line DATA_B, a first initialization voltage line VINT_1, a first initialization voltage line VINT_1, a first high voltage power line ELVDD_1 and a first low voltage power line ELVSS_1.

The first to third data lines DATA_R, DATA_G and DATA_B may be disposed to correspond to all of the pixels P. The high voltage power line ELVDD_1 may be disposed to correspond to all of the pixels P.

The second wirings ELVSS_2, ELVDD_2, EM, GW, GI and VINT_2 may be substantially the same with second wirings described with reference to FIG. 3.

In exemplary embodiments, the first low voltage power line EVLSS_1 and the second low voltage power line ELVSS_2 for supplying a low power supply voltage may cross each other along the first direction and the second direction such that electrical resistances of those would be reduced.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages of the invention. Accordingly, all such modifications are intended to be included within the scope of exemplary embodiments as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting display device comprising:
    a substrate;
    a plurality of pixels disposed along a first direction and a second direction, the first direction and the second direction being substantially parallel to a top surface of the substrate and substantially perpendicular to each other;
    first wirings which are disposed on the substrate, extend in the first direction, and include a first low voltage power line; and
    second wirings which are disposed on the substrate, extend in the second direction, and include a second low voltage power line electrically connected to the first low voltage power line.

2. The organic light emitting display device of claim 1, wherein the first wirings further include data lines, a first initialization voltage line, and a first high voltage power line.

3. The organic light emitting display device of claim 2, wherein the second wirings further include:
    a second initialization voltage line electrically connected to the first initialization voltage line; and
    a second high voltage power line electrically connected to the first high voltage power line.

4. The organic light emitting display device of claim 3, wherein the first low voltage power line, the first initialization voltage line and the first high voltage power line are disposed in correspondence with each of the plurality of pixels.

5. The organic light emitting display device of claim 3, wherein the plurality of pixels include a (3n-2)th pixel, a (3n-1)th pixel and a (3n)th pixel which are sequentially arranged along the second direction, where n is an integer greater than 0.

6. The organic light emitting display device of claim 5, wherein the first low voltage power line is disposed in correspondence with at least one pixel among the (3n-2)th pixel, the (3n-1)th pixel and the (3n)th pixel,
    the first initialization voltage line is disposed in correspondence with at least one pixel among the (3n-2)th pixel, the (3n-1)th pixel and the (3n)th pixel, and
    the first high voltage power line is disposed in correspondence with at least one pixel among the (3n-2)th pixel, the (3n-1)th pixel and the (3n)th pixel.

7. The organic light emitting display device of claim 5, wherein the first low voltage power line is disposed in correspondence with at least two pixels among the (3n-2)th pixel, the (3n-1)th pixel and the (3n)th pixel,
    the first initialization voltage line is disposed in correspondence with at least two pixels among the (3n-2)th pixel, the (3n-1)th pixel and the (3n)th pixel, and
    the first high voltage power line is disposed in correspondence with at least two pixels among the (3n-2)th pixel, the (3n-1)th pixel and the (3n)th pixel.

8. The organic light emitting display device of claim 3, wherein the plurality of pixels an odd-numbered pixel and an even-numbered pixel which are sequentially arranged along the second direction.

9. The organic light emitting display device of claim 8, wherein the first low voltage power line is disposed in correspondence with one of the odd-numbered pixel and the even-numbered pixel,
    the first initialization voltage line is disposed in correspondence with one of the odd-numbered pixel and the even-numbered pixel, and
    the first high voltage power line is disposed in correspondence with the odd-numbered pixel and the even-numbered pixel.

10. The organic light emitting display device of claim 8, wherein the first low voltage power line is disposed in correspondence with the odd-numbered pixel and the even-numbered pixel,
 the first initialization voltage line is disposed in correspondence with one of the odd-numbered pixel and the even-numbered pixel, and
 the first high voltage power line is disposed in correspondence with one of the odd-numbered pixel and the even-numbered pixel.

11. The organic light emitting display device of claim 8, wherein the first low voltage power line is disposed in correspondence with one of the odd-numbered pixel and the even-numbered pixel,
 the first initialization voltage line is disposed in correspondence with the odd-numbered pixel and the even-numbered pixel, and
 the first high voltage power line is disposed in correspondence with one of the odd-numbered pixel and the even-numbered pixel.

12. The organic light emitting display device of claim 1, wherein each of the plurality of pixels a first sub-pixel, a second sub-pixel, a third sub-pixel and a transmission portion.

13. The organic light emitting display device of claim 12, wherein each of the first sub-pixel, the second sub-pixel and the third sub-pixel includes a pixel circuit, and
 wherein the pixel circuit includes a storage capacitor, a light emitting diode and at least six transistors.

14. The organic light emitting display device of claim 13, wherein the light emitting diode includes a first electrode, an organic light emitting layer and a second electrode, and
 wherein the first electrode, the organic light emitting layer and the second electrode are sequentially stacked.

15. The organic light emitting display device of claim 14, wherein the second electrode is electrically connected to the first low voltage power line and the second low voltage power line.

16. The organic light emitting display device of claim 14, wherein the second electrode is disposed in the first sub-pixel, the second sub-pixel and the third sub-pixel, and
 wherein the second electrode exposes the transmission portion.

17. The organic light emitting display device of claim 14, wherein the first sub-pixel, the second sub-pixel and the third sub-pixel are spaced apart from one another, and are sequentially disposed along the second direction, and
 wherein the transmission portion is spaced apart from the first through third sub-pixels, and is disposed along the first direction from the first through third sub-pixels.

18. The organic light emitting display device of claim 14, wherein a transmittance of the transmission portion is higher than those of the first sub-pixel, the second sub-pixel and the third sub-pixel, and
 wherein the first wirings and the second wirings are separated from the transmission portion.

19. The organic light emitting display device of claim 13, wherein each of the transistors includes an active pattern, a gate electrode, a source electrode and a drain electrode, and
 wherein the second low voltage power line includes a same material as that of the active pattern.

20. The organic light emitting display device of claim 19, wherein the first low voltage power line includes a same material as that of the source electrode and the drain electrode.

* * * * *